US007940524B2

(12) United States Patent
Rummel et al.

(10) Patent No.: US 7,940,524 B2
(45) Date of Patent: May 10, 2011

(54) REMOTE COOLING OF A PHASED ARRAY ANTENNA

(75) Inventors: Kerrin A. Rummel, Richardson, TX (US); Gregory Schaefer, McKinney, TX (US); Kevin W. Chen, McKinney, TX (US); Brandon H. Allen, Wylie, TX (US); Daniel J. Weissman, Allen, TX (US)

(73) Assignee: Raytheon Company, Waltham, MA (US)

( * ) Notice: Subject to any disclaimer, the term of this patent is extended or adjusted under 35 U.S.C. 154(b) by 200 days.

(21) Appl. No.: 11/865,475

(22) Filed: Oct. 1, 2007

(65) Prior Publication Data

US 2009/0084527 A1 Apr. 2, 2009

(51) Int. Cl.
*H05K 7/20* (2006.01)

(52) U.S. Cl. ........ 361/689; 361/688; 361/699; 361/700; 343/709; 343/777; 343/874; 455/562.1

(58) Field of Classification Search ............. 361/679.47, 361/689, 699, 702, 709, 715, 721, 735, 752
See application file for complete search history.

(56) References Cited

U.S. PATENT DOCUMENTS

| | | | | |
|---|---|---|---|---|
| 5,684,493 | A * | 11/1997 | Floyd et al. | 343/709 |
| 6,263,215 | B1 * | 7/2001 | Patton et al. | 455/561 |
| 6,305,463 | B1 * | 10/2001 | Salmonson | 165/80.3 |
| 6,536,516 | B2 * | 3/2003 | Davies et al. | 165/170 |
| 7,092,255 | B2 * | 8/2006 | Barson et al. | 361/699 |
| 7,363,701 | B1 * | 4/2008 | Ehret et al. | 29/610.1 |
| 7,409,226 | B1 * | 8/2008 | Stevenson | 455/562.1 |
| 7,443,354 | B2 * | 10/2008 | Navarro et al. | 343/777 |
| 7,508,338 | B2 * | 3/2009 | Pluymers et al. | 342/175 |
| 2008/0156462 | A1 * | 7/2008 | Arik et al. | 165/80.4 |

FOREIGN PATENT DOCUMENTS

| | | |
|---|---|---|
| DE | 35 22 127 | 1/1987 |
| EP | 1 753 073 | 2/2007 |
| GB | 2 315 601 | 2/1998 |
| JP | 10 051213 | 2/1998 |
| JP | 2002 228321 | 8/2002 |
| JP | 2003 037436 | 2/2003 |
| WO | WO 02/23966 | 3/2002 |

OTHER PUBLICATIONS

PCT Notification of Transmittal of the International Search Report and the Written Opinion of the International Searching Authority or the Declaration, PCT/US2008/078068, 16 pages, Apr. 27, 2009.

* cited by examiner

*Primary Examiner* — Jayprakash N Gandhi
*Assistant Examiner* — Courtney Smith
(74) *Attorney, Agent, or Firm* — Baker Botts L.L.P.

(57) ABSTRACT

A self-contained cooling system for a phased array antenna includes a cooling structure, a heat exchanger, and a pump for circulating a fluid coolant around a coolant loop. The cooling system receives power from a remote power source. The cooling structure includes a plurality of coolant inlet pipes, a plurality of coolant outlet pipes, and a plurality of cooling platforms. Each of the cooling platforms has a coolant channel that begins at one of the plurality of coolant inlet pipes, terminates at one of the plurality of coolant outlet pipes, and provides a flow path for a fluid coolant. The cooling structure further includes at least one base plate releasably mounted to at least one of the plurality of cooling platforms. One or more antenna elements associated with the phased array antenna are mounted on the base plate releasably mounted to at least one of the plurality of cooling platforms. The flow of the fluid coolant through the coolant channel dissipates thermal energy produced by the one or more antenna elements.

15 Claims, 2 Drawing Sheets

REMOTE COOLING OF A PHASED ARRAY ANTENNA

TECHNICAL FIELD

This disclosure relates generally to the field of cooling systems, and more particularly to an antenna system and a cooling structure for cooling a phased array antenna.

BACKGROUND

An active electronically scanned array (AESA) is a phased array antenna that may be used on vessels such as Naval ships. An AESA may generally include an array of antenna elements positioned at the top of the mast of a ship. The antenna elements include numerous electronic circuits which consume large amounts of power and produce high levels of heat. As phased array technology moves to higher power, smaller systems, a need has developed to develop means for cooling large amounts of dissipated heat in an array that is located a distance from the host.

A conventional method of cooling higher heat level electronic devices, such as those which may be used in an antenna system, is to directly couple the electronic device to a cold plate. The flow of coolant through tracks in the cold plate may dissipate the heat produced by the electronic circuits and thereby cool the antenna elements. Although refrigeration units of this type have been generally adequate for certain applications, they have not been satisfactory in all respects for vessel based antenna systems.

SUMMARY OF THE DISCLOSURE

In one embodiment, a self-contained cooling system for a phased array antenna includes a cooling structure, a heat exchanger, and a pump for circulating a fluid coolant around a coolant loop. The cooling system receives power from a remote power source. The cooling structure includes a plurality of coolant inlet pipes, a plurality of coolant outlet pipes, and a plurality of cooling platforms. Each of the cooling platforms has a coolant channel that begins at one of the plurality of coolant inlet pipes, terminates at one of the plurality of coolant outlet pipes, and provides a flow path for a fluid coolant. The cooling structure further includes at least one base plate releasably mounted to at least one of the plurality of cooling platforms. One or more antenna elements associated with the phased array antenna are mounted on the base plate releasably mounted to at least one of the plurality of cooling platforms. The flow of the fluid coolant through the coolant channel dissipates thermal energy produced by the one or more antenna elements.

The present disclosure also provides an antenna system for a vessel. In one embodiment, the antenna system includes a phased array antenna having a plurality of antenna elements and a cooling system. The cooling system is a closed loop cooling system and the antenna system is positioned on a mast of the vessel and is powered by a remote power source. In a particular embodiment, the cooling system includes a heat exchanger, a pump, a fan, a coolant loop, and a cooling structure that contains the plurality of antenna elements.

Certain embodiments provided in the present disclosure may offer several technical advantages over prior antenna systems and cooling structures. For instance, particular embodiments may provide the ability to remotely cool a phased array antenna positioned on a mast of a vessel without having to pump coolant up the mast. Additionally, certain embodiments may provide ready access to antenna elements in a cooling structure for replacement and repair. Another technical advantage that may be provided is the ability to access antenna elements disconnecting coolant pipes, electrical connections, or structural supports.

Other technical advantages will be readily apparent to one skilled in the art from the following figures, descriptions, and claims. Moreover, while specific advantages have been enumerated above, various embodiments may include all, some or none of the enumerated advantages.

BRIEF DESCRIPTION OF THE DRAWINGS

For a more complete understanding of the present disclosure and its advantages, reference is now made to the following description, taken in conjunction with the accompanying drawings, in which.

DETAILED DESCRIPTION OF THE DRAWINGS

Figure 1:
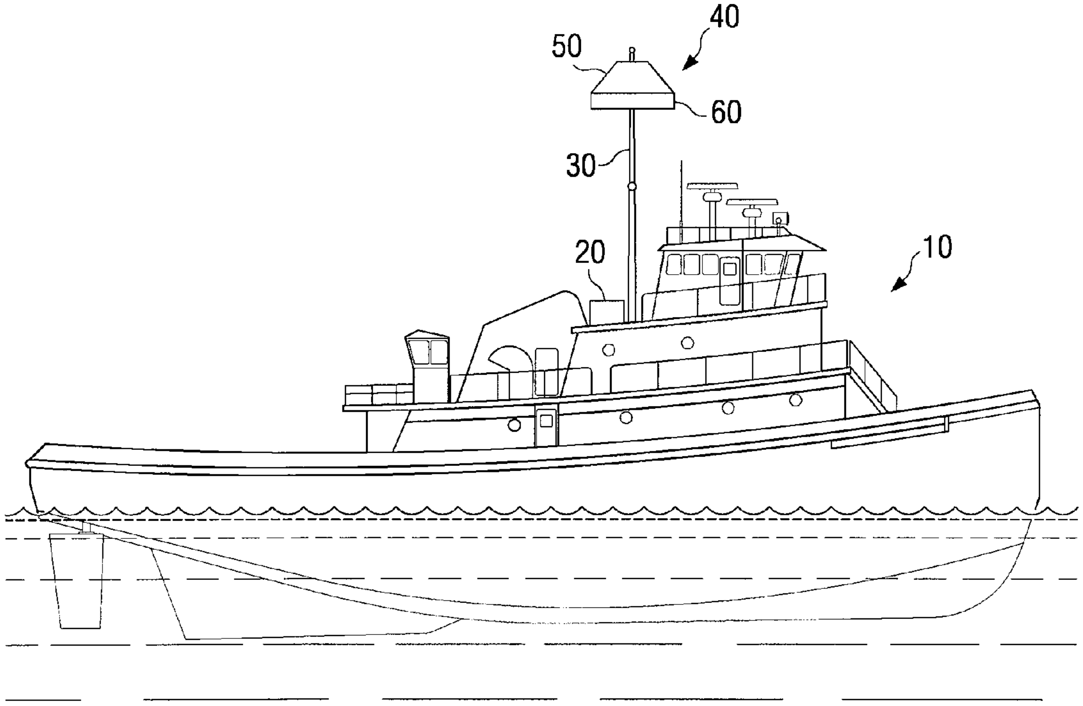
FIG. 1 is a simplified block diagram illustrating an antenna system for a vessel in accordance with a particular embodiment.

FIG. 1 illustrates an antenna system 40 for a vessel 10. In the illustrated embodiment, antenna system 40 is positioned on mast 30 and includes antenna 50 and cooling system 60. In operation, antenna system 40 may receive power from a remote power source 20. For purposes of this specification, remote power source 20 may be any device that generates an electrical current for operating antenna system 40 that is physically separated from antenna system 40.

Antenna 50 may, among other things, transmit and receive electromagnetic waves to identify the position, range, altitude, direction of movement and/or speed of a fixed or moving object. In a particular embodiment, antenna 50 represents a phased array antenna such as an active electronically scanned array (AESA). Accordingly, antenna 50 may include one or more arrays of antenna elements. The antenna elements may generally include any suitable combination and/or arrangement of electronic components for transmitting and receiving electromagnetic waves. While the disclosure may be detailed with respect to antenna 50 representing a phased array antenna, embodiments of antenna 50 may vary greatly.

During operation, electronic components of antenna 50 may produce large amounts of thermal energy. The thermal energy, may, if not cooled, cause antenna 50 to malfunction or be otherwise damaged. To prevent overheating, cooling system 60 may dissipate heat generated by antenna components. Specifically, cooling system 60 may facilitate the transfer of thermal energy from various antenna elements to a fluid coolant. While antenna 50 and cooling system 60 may be illustrated as distinct components, certain embodiments of antenna system 50 may combine cooling system 60 and components of antenna 50.

According to a particular embodiment, cooling system 60 is self-contained and integrated within antenna system 40. Specifically, cooling system 60 may be a closed-loop cooling system that includes all the functional components for cooling antenna 50. Thus, cooling system 60 may be fully operable with only receiving power from remote power source 20. Therefore, unlike previous vessel-based antenna cooling systems, cooling system 60 may cool antenna 50 without requiring the pumping of coolant or other fluids up mast 30.

Figure 2:
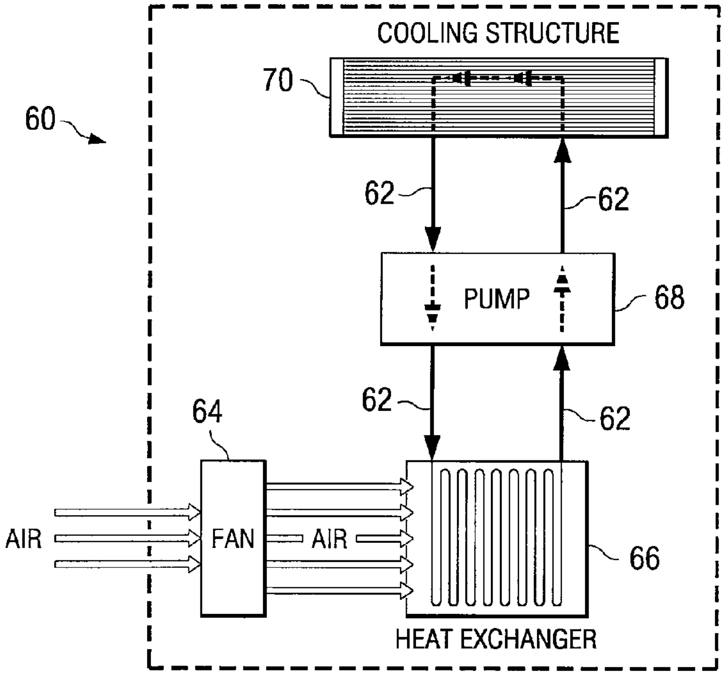
FIG. 2 is a simplified block diagram of a cooling system in accordance with a particular embodiment.

FIG. 2 is a simplified block diagram of cooling system 60 in accordance with a particular embodiment. Cooling system 60 includes a fan 64, a heat exchanger 66, a pump 68, and a cooling structure 70. In general, cooling structure 70 may be a standard cold plate or other device operable to transfer thermal energy from one or more heat generating devices, such as components of antenna 50 of FIG. 1, to a fluid coolant.

In operation, a fluid coolant may circulate through coolant loop 62 to absorb heat produced by antenna components (not illustrated) that may be contained within cooling structure 70. The flow of coolant through coolant loop 62 may be effected by pump 68 which may facilitate the circulation of coolant between heat exchanger 66 and cooling structure 70. Heat exchanger 66 may receive coolant that has absorbed thermal energy while traveling through cooling structure 70 and remove heat from the coolant. To facilitate cooling, fan 64 may force a flow of air through heat exchanger 66. Heat from the coolant may be transferred to the air, thereby lowering the temperature of the coolant.

In certain embodiments, size and space constraints may dictate the design parameters of antenna system 40 and cooling system 60. For instance, available space on vessel 10 may require a relatively compact structure. Notwithstanding potential design constraints, ready access to components of antenna 50 is particularly desirable for repair and replacement purposes.

In a standard cold plate design, a heat generating device is permanently affixed or mounted directly to a removable cold plate. Although removable, a standard cold plate may be difficult to disconnect from electrical, coolant conduits, and/or structural connections. Additionally, disconnecting the cold plate from a coolant conduit runs the risk of spilling coolant on the attached heat generating device. While a standard cold plate may be suitable for certain applications, it may not be ideal for a vessel-based antenna system.

Figure 3A:
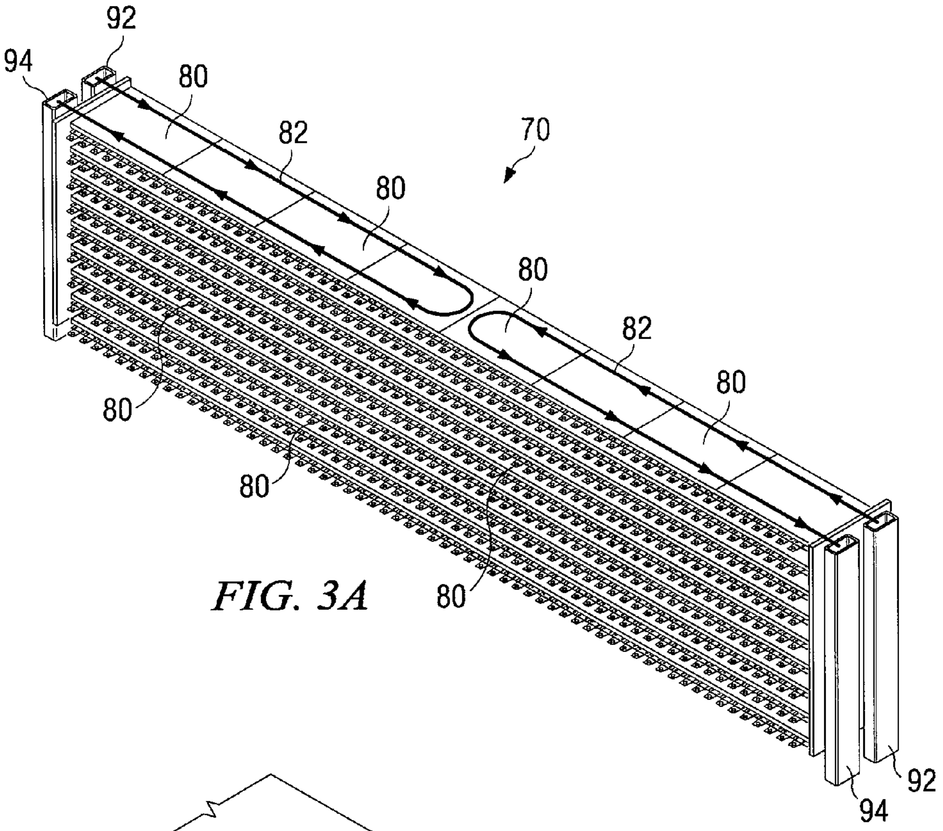
FIGS. 3A and 3B are simplified block diagrams of a cooling structure in accordance with certain embodiments.
Figure 3B:
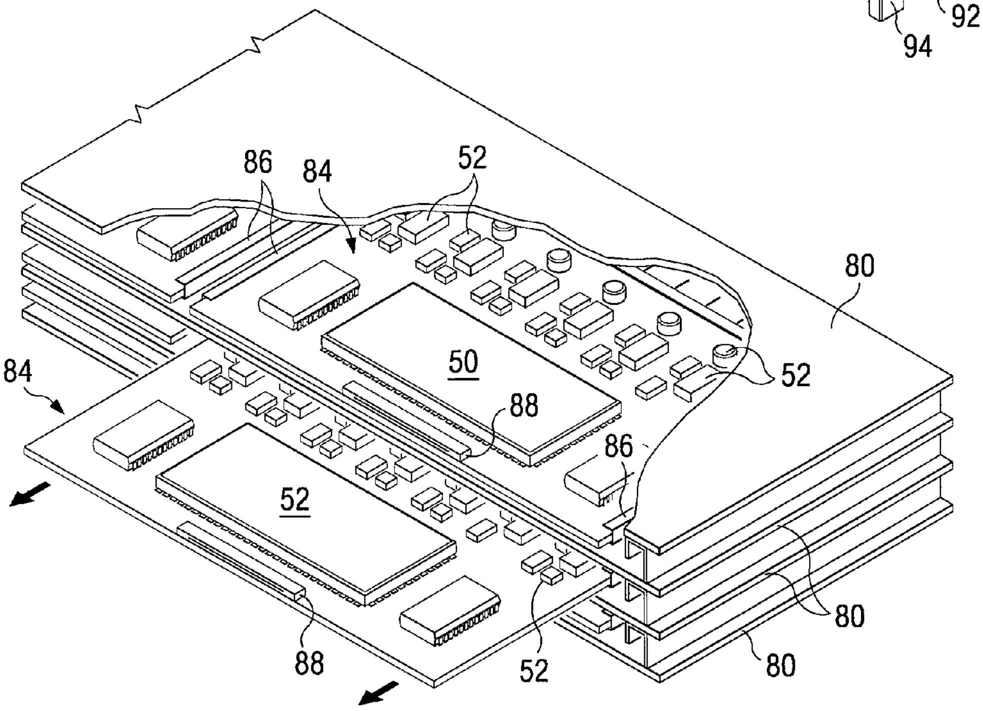

FIGS. 3A and 3B illustrate an example embodiment of a cooling structure 70 for cooling antenna elements 52. Antenna elements 52 may represent heat generating components associated with an antenna such as antenna 50 of FIG. 1. Embodiments of cooling structure 70 may provide structural support and temperature control for antenna elements 52. Additionally, certain embodiments of cooling structure 70 may permit ready access to antenna elements 52 without disconnecting coolant pipes, electrical connections, or structural supports.

With reference to FIG. 3A, cooling structure 70 includes a plurality of stacked cooling platforms 80, inlet pipes 92, and outlet pipes 94. In the illustrated embodiment, each cooling platform 80 has a plurality of internal coolant channels 82 through which a fluid coolant may flow. As illustrated, each coolant channel 82 may start at an inlet pipe 92 and terminate at an outlet pipe 94. Although the illustrated embodiment indicates that each cooling platform 80 has multiple coolant channels 82, in particular embodiments one or more cooling platforms 80 may have a single coolant channel 82.

In various embodiments, inlet pipes 92 and outlet pipes 94 may serve multiple functions. According to one embodiment, inlet pipes 92 and outlet pipes 94 may structurally support cooling platforms 80. In particular, inlet pipes 92 and outlet pipes 94 may be substantially perpendicular to cooling platforms 80 to support a load exerted by cooling platforms 80 and the coolant flowing through the cooling platforms 80. In certain embodiments, inlet pipes 92 and outlet pipes 94 may also function as coolant conduits. For example, inlet pipes 92 may receive a fluid coolant from a heat exchanger, such as heat exchanger 66 of FIG. 2, and distribute the fluid coolant to coolant channels 82 of cooling platforms 80. Outlet pipes 94 may receive the fluid coolant exiting coolant channels 82 and transport the coolant to a heat exchanger such as heat exchanger 66 of FIG. 1. Combining the functions of structural support with coolant distribution may decrease the weight, cost, and complexity of cooling structure 70.

In operation, cooling platforms 80 may facilitate the transfer of thermal energy to a fluid coolant. To support this functionality, cooling platforms 80 may be manufactured from a conductive material such as aluminum, copper, or other suitable material for transferring thermal energy to a fluid coolant. The coolant may enter the flow path 82 of a cooling platform 80 via an inlet pipe 92. While traveling through the flow path 82 the coolant may absorb thermal energy and exit outlet pipe 94. In certain modes of operation, the coolant may be a two-phase coolant and vaporize as a result of the absorption of thermal energy. In other embodiments, the coolant may remain in a liquid phase while circulating through cooling structure 70. Examples of suitable coolants may include, water, ethanol, methanol, FC-72, ethylene glycol, propylene glycol, fluoroinert or any suitable antifreeze.

Referring now to FIG. 3B, a detailed view of a section of cooling structure 70 is provided. In the illustrated embodiment, antenna elements 52 are mounted to base plates 84 in any suitable arrangement. Antenna elements 52 may generally represent components of an antenna. The base plates 84 may be in thermal contact with a cooling platform 80. In general, base plates 84 may be any suitable support structure to which a heat generating device such as, antenna elements 52 may be attached. Base plates 84 may be made of any type of material that conducts thermal energy or heat. For example, base plates 84 may be made of aluminum or copper.

In operation, base plates 84 may facilitate the transfer of thermal energy from antenna elements 50 to a cooling platform 80. As mentioned, base plates 84 may be in thermal contact with a cooling platform 80. Thus, heat generated by antenna elements 52 may be transferred to a cooling platform 80 via a base plate 84. As previously described, the cooling platform 80 may thereby transfer the produced thermal energy to a fluid coolant flowing through a cooling channel 82. Therefore, cooling structure 70 may be a suitable device for dissipating heat produced by a heat generating device such as antenna elements 52.

In a particular embodiment, base plates 84 may be releasably mounted to a cooling platform 80. Providing a removable connection may provide ready access to antenna elements 50 for replacement and repair. Moreover, because base plates 84 may not be directly connected to coolant inlet pipe 92 and coolant outlet pipe 94, disconnecting coolant connections may not be required in order to access antenna elements 52. Thus, there may be little risk of spilling coolant on antenna elements 52.

FIG. 3B illustrates one method for releasably mounting a base plate 84 to a cooing platform 80. As illustrated, by base plate 84*a*, a given base plate 84 may be slidably associated with a cooling platform 80. In such an embodiment, each cooling platform 80 may include one or more tracks 86 for guiding and positioning a base plate 84. Cooling platforms 80 may also include a locking mechanism 88 for releasably securing a base plate 84 within cooling structure 70. Examples of locking mechanism 88 may include, for example, a latch, a connector, a clamp, or a releasable interference fit device. Although FIG. 3B illustrates a particular means for mounting a base plate 84 to a cooling platform 80, any suitable method, device, or component may be implemented.

Modifications, additions, or omissions may be made to cooling structure 70. For example, each cooling platform 80 may have any suitable number of coolant channels 82. Additionally, cooling structure 70 may have any suitable number of inlet pipes 92 and outlet pipes 94. Further, while cooling structure 70 has been described in detail with respect to antenna elements of a phased array antenna, cooling structure 70 may be used to dissipate thermal energy produced by any heat generating element or devices.

Although the present disclosure recites several specific embodiments, a myriad of changes, variations, alterations, transformations, and modifications may be suggested to one skilled in the art, and it is intended that the present disclosure encompass such changes, variations, alterations, transformation, and modifications as they fall within the scope of the appended claims.

What is claimed is:

1. A closed-loop cooling system for a phased array antenna comprising:

a cooling structure comprising:
- a plurality of coolant inlet pipes;
- a plurality of coolant outlet pipes;
- a plurality of cooling platforms each comprising a coolant channel, wherein the coolant channel:
  - begins at one of the plurality of coolant inlet pipes;
  - terminates at one of the plurality of coolant outlet pipes; and
  - provides a flow path for a fluid coolant;
- at least one base plate releasably mounted to at least one of the plurality of cooling platforms; and
- wherein:
  - one or more antenna elements associated with the phased array antenna are mounted to the at least one base plate releasably mounted to at least one of the plurality of cooling platforms; and
  - the flow of the fluid coolant through the coolant channel dissipates thermal energy produced by the one or more antenna elements;

a heat exchanger;

a pump for circulating the fluid coolant around a coolant loop;

wherein the closed-loop cooling system and phased array antenna are positioned on a mast of a vessel; and wherein the cooling system receives power from a power source that is remote from the mast.

2. The cooling system of claim 1, wherein the phased array antenna is an active electronically scanned array.

3. The cooling system of claim 1, wherein the base plate is slidably associated with the cooling platform.

4. The cooling system of claim 1, wherein:

the plurality of inlet pipes distribute the fluid coolant to the plurality of coolant platforms; and the plurality of outlet pipes receive the fluid coolant from the plurality of coolant platforms.

5. The cooling system of claim 4, wherein the plurality of inlet pipes are substantially perpendicular to the plurality of cooling platforms thereby supporting a load exerted by the cooling platforms.

6. The cooling system of claim 4, wherein:

the plurality of inlet pipes receive coolant from the heat exchanger; and the plurality of outlet pipes transport the fluid coolant to the heat exchanger.

7. The cooling structure of claim 1, wherein the at least one base plate is in thermal contact with the cooling platform.

8. An antenna system for a vessel comprising:

a phased array antenna comprising a plurality of antenna elements; and a cooling system thermally coupled to the plurality of antenna elements, wherein the cooling system is a closed-loop cooling system, the cooling system comprising:
- a plurality of coolant inlet pipes;
- a plurality of coolant outlet pipes;
- a plurality of cooling platforms each comprising a coolant channel, wherein the coolant channel:
  - begins at one of the plurality of coolant inlet pipes;
  - terminates at one of the plurality of coolant outlet pipes; and
  - provides a flow path for a fluid coolant;
- a base plate releasably mounted to at least one of the plurality of cooling platforms, wherein one or more antenna elements associated with the phased array antenna are mounted to the base plate releasably mounted to at least one of the plurality of cooling platforms; and wherein the antenna system and the cooling system are positioned on a mast of the vessel and the cooling system is powered by a power source that is remote from the mast.

9. The antenna system of claim 8, wherein the cooling system comprises:

a heat exchanger;

a pump;

a fan; and a coolant loop.

10. The antenna system of claim 8, wherein:

the flow of the fluid coolant through the coolant channel dissipates thermal energy produced by the one or more antenna elements.

11. The antenna system of claim 8, wherein the phased array antenna is an active electronically scanned array.

12. A method for cooling a phased array antenna comprising:

receiving, by a base plate, thermal energy generated by an antenna element associated with the phased array antenna, wherein:
- the phased array antenna is positioned on a mast of a vessel;
- the antenna element is mounted to the at least one base plate; and
- the base plate is releasably mounted to one of a plurality of cooling platforms;

pumping, through a pump positioned on the mast of the vessel, a fluid coolant through a plurality of coolant channels, wherein each of the plurality of coolant channels:
- is associated with at least one of the plurality of cooling platforms;
- begins at one of a plurality of coolant inlet pipes;
- terminates at one of a plurality of coolant outlet pipes; and
- provides a flow path for the fluid coolant;

absorbing, by the fluid coolant, thermal energy from the base plate, the thermal energy generated by the antenna element; and receiving power from a power source positioned remotely from the mast.

13. The method of claim 12, wherein the phased array antenna is an active electronically scanned array.

14. The method of claim 12, further comprising:

receiving, by the plurality of inlet pipes, fluid coolant from a heat exchanger; and transporting, by the plurality of outlet pipes, fluid coolant to the heat exchanger.

15. The method of claim 12, further comprising distributing, by the plurality of inlet pipes, fluid coolant to the plurality of coolant channels.

* * * * *